(12) United States Patent
Okuno

(10) Patent No.: US 7,196,346 B2
(45) Date of Patent: Mar. 27, 2007

(54) SEMICONDUCTOR MEMORY DEVICE AND METHOD FOR FABRICATING THE SAME

(75) Inventor: Yasutoshi Okuno, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/863,330

(22) Filed: Jun. 9, 2004

(65) Prior Publication Data

US 2005/0006681 A1    Jan. 13, 2005

(30) Foreign Application Priority Data

Jul. 9, 2003    (JP) ............................. 2003-194216

(51) Int. Cl.
*H01L 47/00*    (2006.01)
(52) U.S. Cl. .......................... 257/5; 438/128
(58) Field of Classification Search ................ 438/256, 438/399, 627–629, 652, 672, 675, 95–96, 438/128–132, 102, 900, 596, 622, 625, 637; 257/758, 774, 2–5, E31.029, E27.085, E29.17; 365/100, 148, 163
See application file for complete search history.

(56) References Cited

U.S. PATENT DOCUMENTS

| | | | |
|---|---|---|---|
| 6,236,059 B1 | 5/2001 | Wolstenholme et al. | |
| 6,656,785 B2 * | 12/2003 | Chiang et al. | 438/240 |
| 6,743,672 B2 * | 6/2004 | Park | 438/253 |
| 6,838,772 B2 * | 1/2005 | Saitoh et al. | 257/758 |
| 2005/0030800 A1 * | 2/2005 | Johnson et al. | 365/200 |

OTHER PUBLICATIONS

Hwang, Y.N., et al. "Full integration and reliability evaluation of phase-change on .24/spl mu/m-CMOS technologies." 2003 Symposium on VLSI Technology Digest of Technical Papers, pp. 1-2 http://ieeexplore.ieee.org.
Ha, Y.H., et al. "An Edge Contact Type Cell for Phase Change RAM Featuring Very Low Power Consumption." 2003 Symposium on VLSI Technology Digest of Technical Papers, pp. 1-2.
Horii, H., et al. "A Novel Cell Technology Using N-doped GeSbTe Films for Phase Change RAM." 2003 Symposium on VLSI Technology Digest of Technical Papers, pp. 1-2.

* cited by examiner

*Primary Examiner*—David Vu
(74) *Attorney, Agent, or Firm*—McDermott Will & Emery LLP

(57) ABSTRACT

In a fabrication method according to the present invention, a first insulating film and tungsten plugs are formed over a substrate including a logic section and a memory section. An upper portion of one of the tungsten plug located in a memory section is removed, thereby forming a recess. A resistance heating element film covering side and bottom surfaces of the recess and a storage element film filling the recess with the resistance heating element film interposed between the storage element film and the plug are formed. Then, a Cu interconnect is formed on the storage element film. Thus, it is possible to make the process step of forming the resistance heating element film and the storage element film have higher consistency with a logic process.

5 Claims, 4 Drawing Sheets

SEMICONDUCTOR MEMORY DEVICE AND METHOD FOR FABRICATING THE SAME

BACKGROUND OF THE INVENTION

The present invention relates to a nonvolatile memory using resistance change accompanied with phase change and a method for fabricating the same.

As a known semiconductor memory device using a chalcogenide material, for example, semiconductor memory device is disclosed in U.S. Pat. No. 6,236,059. FIG. 5 is a cross-sectional view of the known semiconductor memory device using a chalcogenide material disclosed in U.S. Pat. No. 6,236,059.

Respective steps for fabricating a nonvolatile memory of FIG. 5 will be described. First, an interlayer insulating film 104 deposited over a silicon substrate 102 is patterned to form a contact hole 106 reaching the silicon substrate 102. Then, polysilicon (not shown) is deposited over the interlayer insulating film 104 by thermal CVD to fill the contact hole 106 and then part of polysilicon located on the interlevel insulating film 104 is removed by CMP. Thereafter, a recess is formed by selectively etching the polysilicon to remove upper part of the polysilicon in the contact hole 106. Thus, a plug 108 is formed.

Then, a TiN film (not shown) is deposited over the interlevel insulating film 104 to fill the recess and part of the TiN film located on the interlevel insulating film 104 is selectively removed by CMP. Furthermore, etching is performed to remove upper part of the TiN film filling upper part of the contact hole 106, thereby forming a recess. Thus, a resistance heating element film 110 made of TiN is formed on the plug 108. An SiN film (not shown) is deposited over the interlevel insulating film 104 by CVD to fill the recess and then part of the SiN film located on the interlevel insulating film 104 is removed by selectively polishing the part by CMP. Thus, an interlevel insulating film 112 filling the recess is formed. Thereafter, in a center part of the interlevel insulating film 112, a small hole reaching the resistance heating element film 110 is formed. Then, chalcogenide (GeSbTe, which is not shown) used as a memory material is deposited by sputtering to fill the hole. Thereafter, part of GeSbTe located on the interlevel insulating film 104 is selectively removed by CMP to form a storage element film 114. Then, a barrier metal 116 and an interconnect 118 covering the storage element film 114 and parts of the interlevel insulating film 112 located around the storage element film 114 are formed.

Of the above-described steps, the steps of forming the contact hole 106, the plug 108, the barrier metal 116 and the interconnect 118 can be performed according to a logic process. That is, in a technique disclosed in U.S. Pat. No. 6,236,059, the storage element film 114 is buried in the interlevel insulating film 112, thereby improving consistency with a logic process. However, the thickness of the interlevel insulating film 104 in a logic section is increased according to the thickness of a storage element buried therein. Accordingly, the depth of a contact in the logic section is increased, so that an interconnect delay is increased.

As has been described, in a known method, although it is possible to make some of the steps for fabricating a storage element have consistency with a logic process, a complicated step has to be performed separately from the logic process.

Specifically, the step of filling the recess in the plug 108 with the TiN film, i.e., a low resistance material and flattening the film, the step of etching the TiN film to form a recess, the step of filling the SiN film and flattening the film, the step of performing lithography and etching to the filled SiN film to form a hole, and the step of filling the hole with a memory material and flattening the material have to be performed separately from a logic process. As has been described, process steps for integrating storage elements are complicated and make reduction in the size of each element difficult.

SUMMARY OF THE INVENTION

It is an object of the present invention to further improve, in a semiconductor memory device including a logic section and a memory section, consistency of processes for forming a memory section with a logic process and make it possible to reduce the size of the device.

A semiconductor memory device according to the present invention has a structure in which side and bottom surfaces of a storage element in a memory section is covered with a resistance heating element. This structure can be formed according to a logic process. Accordingly, process steps for fabricating a semiconductor memory device including a logic section and a memory section can be simplified, so that the number of fabrication process steps can be reduced as a whole. Moreover, the structure of the memory section is simplified. Therefore, size reduction and integration of elements become possible.

More specifically, the semiconductor memory device of the present invention includes: a substrate; an insulating film formed on the substrate; a storage element formed in an upper portion of the insulating film; a resistance heating element covering lower and side surfaces of the storage element; a plug provided in a region of the insulating film located under the storage element and being in contact with part of the resistance heating element covering the lower surface of the storage element and the substrate; and an interconnect being in contact with an upper surface of the storage element.

The resistance heating element and the storage element in this structure can be formed by a fabrication method including less fabrication process steps such as lithography and etching performed separately from a logic process, compared to the case of fabricating a known semiconductor memory device in which a resistance heating element film covers only a lower surface of a storage element film. Furthermore, the respective structures of a storage element film and a resistance heating film are simplified. Therefore, size reduction and integration of elements become possible.

A hole reaching the substrate may be formed in the insulating film, the plug may fill lower part of the hole, and the storage element may fill part of the hole located over the plug with the resistance heating element interposed between the storage element and the plug.

The insulating film may include a first insulating film and a second insulating film provided on the first insulating film, the plug may fill the hole provided in the first insulating film and reaching the substrate, the resistance heating element may cover side and bottom surfaces of a groove provided in the second insulating film and reaching the plug, and the storage element may fill the groove with the resistance heating element interposed between the storage element and the plug.

It is preferable that the storage element is formed of a phase change material.

It is preferable that the resistance heating element is TiAlN, TiSiN, TaAlN or TaSiN.

The substrate may include a memory section and a logic section, the storage element may be provided in part of the substrate located over the memory section, and the plug reaching the substrate may be provided in part of the substrate located over the logic section.

Moreover, a first method for fabricating a semiconductor memory device according to the present invention is a method for fabricating a semiconductor memory device using a substrate including a logic section and a memory section, the method comprising the steps of: a) forming an insulating film on the substrate; b) forming in the insulating film a hole reaching the memory section in the substrate; c) filling the hole with a plug; d) performing etching to remove an upper portion of the plug, thereby forming a recess portion; e) forming a resistance heating element on bottom and side surfaces of the recess portion; f) forming a storage element to fill the recess portion with the resistance heating element interposed between the storage element and the plug; and g) forming an interconnect on the storage element.

In this method, compared to the case of forming the known semiconductor memory device in which a resistance heating element film covers only a lower surface of the storage element film, the number of process steps such as lithography and etching performed separately from a logic process can be reduced. Thus, process steps can be simplified. Furthermore, the respective structures of a storage element film and a resistance heating element film in a memory section are simplified. Therefore, size reduction and integration of elements become possible.

It is preferable that the storage element is formed of a phase change material.

It is preferable that the resistance heating element is TiAlN, TiSiN, TaAlN or TaSiN.

A second method for fabricating a semiconductor memory device according to the present invention is a method for fabricating a semiconductor memory device using a substrate including a logic section and a memory section, the method comprising the steps of: a) forming a first insulating film on the substrate; b) forming in the first insulating film a hole reaching the memory section in the substrate; c) filling the hole with a plug; d) forming a second insulating film over the first insulating film and the plug; e) forming in the second insulating film a groove reaching the plug; f) forming a resistance heating element covering bottom and side surfaces of the groove; g) forming a storage element filling the groove with the resistance heating element interposed between the storage element and the plug; and h) forming an interconnect on the storage element.

In this method, compared to the case of forming the known semiconductor memory device in which a resistance heating element film covers only a lower surface of the storage element film, the number of process steps such as lithography and etching performed separately from a logic process can be reduced. Thus, process steps can be simplified. Furthermore, the respective structures of a storage element film and a resistance heating element film in a memory section are simplified. Therefore, size reduction and integration of elements become possible.

It is preferable that the storage element is formed of a phase change material.

It is preferable that the resistance heating element is TiAlN, TiSiN, TaAlN or TaSiN.

DESCRIPTION OF THE PREFERRED EMBODIMENTS

First Embodiment

First, a method for fabricating a semiconductor memory device according to the present invention will be described with reference to FIGS. 1A through 1F. FIGS. 1A through 1F are cross-sectional views illustrating respective steps for fabricating a semiconductor memory device according to a first embodiment of the present invention.

Figure 1A:
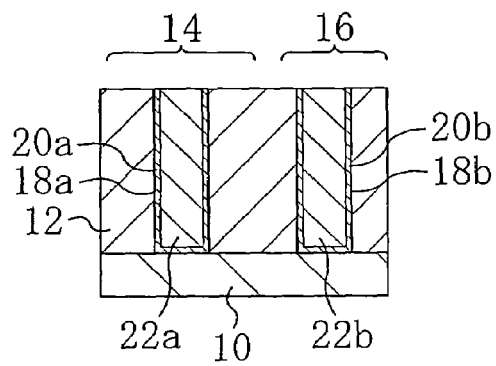
FIGS. 1A through 1F are cross-sectional views illustrating respective steps for fabricating a semiconductor memory device according to a first embodiment of the present invention.

In the method for fabricating a semiconductor memory device according to this embodiment, thermal CVD is first performed in the step of FIG. 1A, thereby forming a first insulating film 12 made of a phosphorus-doped oxide film and having a thickness of 0.8 μm on a 200 mm-diameter silicon substrate 10 on which elements (not shown) are provided. Thereafter, to flat levels generated in an upper surface of the first insulating film 12 resulting from unevenness of an upper surface of the silicon substrate 10, etch back is performed using an inversion mask (not shown) and then flattening is further performed to the first insulating film 12 by CMP until the thickness of the first insulating film 12 becomes 0.5 μm.

Next, in each of a memory section 14 and a logic section 16, photolithography and dry etching are performed, thereby forming contact holes 18a and 18b each having a diameter of 0.1 μm to 0.13 μm in the first insulating film 12 and reaching the silicon substrate 10. Then, adhesion layers 20a and 20b made of TiN and having a thickness of about 10 nm (i.e., a thickness when TiN is deposited in a flat region) are formed on side and bottom surfaces of the contact holes 18a and 18b, respectively. Thereafter, thermal CVD is performed, with $WF_6$ and $SiH_4$ supplied, so that the contact holes 18a and 18b each having a surface on which the adhesion layers 20a and 20b are provided, respectively, are filled with a tungsten layer (not shown). Then, the tungsten layer is polished by CVD, thereby forming tungsten plugs 22a and 22b.

Figure 1D:
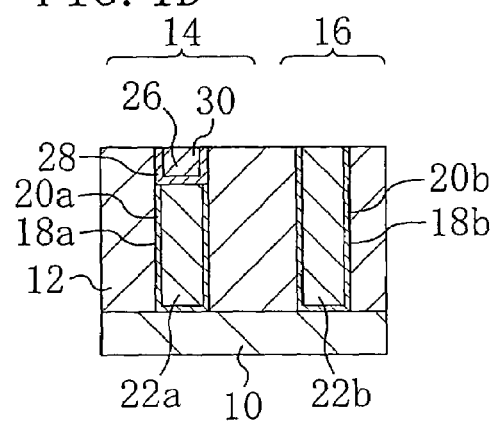
Figure 1B:
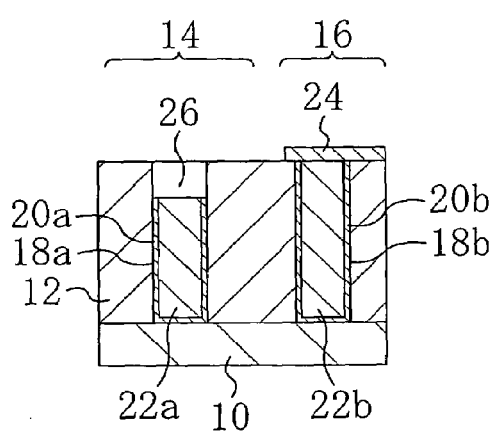

Next, in the step of FIG. 1B, plasma CVD is performed, with a substrate temperature kept at 400° C. and $SiH_4$ and $NH_3$ supplied, to form an SiN film (not shown) covering the first insulating film 12 and the tungsten plugs 22a and 22b and having a thickness of 20 nm. In this case, it is desired that the SiN film is formed at a low temperature so that properties of the tungsten plug 22b and a transistor (not shown) in lower layers are not deteriorated. Next, a resist mask (not shown) having an opening corresponding to the memory section 14 is formed over the SiN film. By performing reactive plasma etching using a $CHF_3$—Ar—$O_2$ gas in the above-described state, a protection film 24 is formed so as to cover the tungsten plug 22b and the first insulating film 12 located around the tungsten plug 22b in the logic section 16. In this case, reactive plasma etching is performed at a process pressure of 50 mTorr (6.65 Pa) and a RF power of 200 W so that a distance by which the tungsten plug 22 protrudes from the upper surface of the first insulating film 12 is minimum.

Next, with the temperature of the substrate kept at 10° C. and $SF_6$ as a reaction gas supplied at a gas flow rate of 100 sccm (ml/min), etching is performed using a parallel-plate reactive dry etching at a RF power of 500 W and a process pressure of 50 mTorr to remove upper part of the tungsten plug 22a. Thus, a recess 26 is formed. Under the above-described condition, the etching selection ratio of tungsten is about 10 times higher than that of an oxide film. In this case, it is preferable that the depth of the recess 26 is smaller than half of the plug diameter of the tungsten plug 22b, i.e., 500 nm to 650 nm. This is because when the recess 26 has a larger depth than this, a void is generated in the GeSbTe film which is to fill the recess 26 in a later process step, so that the GeSbTe film does not function as an excellent storage element film.

Figure 1E:
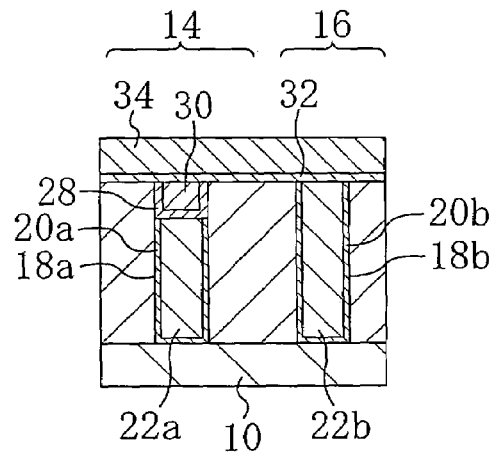
Figure 1C:
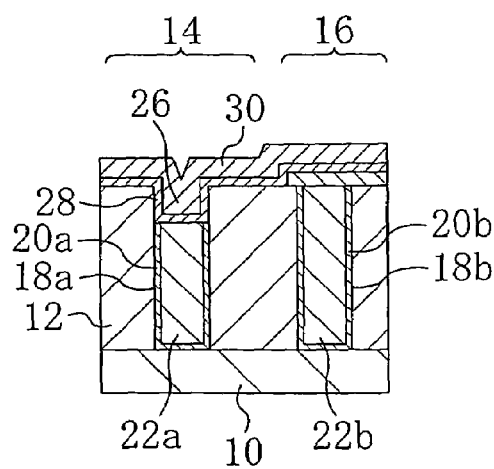
Figure 2:
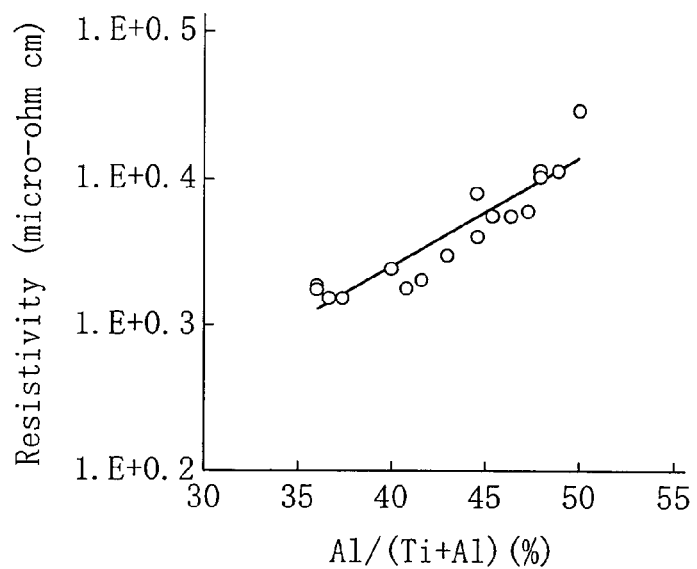
FIG. 2 is a graph showing the relationship between Al composition and resistance value (sheet resistance) for TiAlN, i.e., a material for the resistance heating element film 28.

Next, in the step of FIG. 1C, reactive sputtering is performed, with the temperature and pressure of a reaction chamber (not shown) kept at 100° C. and 0.2 Pa, respectively, and Ar and $N_2$ supplied at flow rates of 21 sccm and 42 sccm, respectively, to form a resistance heating element film (a film which generates heat when a current is applied to the film) 28 made of TiAlN, covering the bottom and side surfaces of the recess 26 and extending on the first insulating film 12 and the protection film 24. In this case, the thickness and composition ratio of the resistance heating element film 28 are adjusted to obtain a target resistance value. The relationship between Al composition ratio and resistance value for TiAlN as a material for the resistance heating element film 28 is as shown in FIG. 2. In FIG. 2, the abscissa indicates Al/(Ti+Al) in atomic percentage and the ordinate indicates a resistance value.

Moreover, a suitable thickness of TiAlN for a plug diameter of 0.1 μm is 10 nm to 20 nm.

Next, sputtering is performed, with the temperature and pressure of the reaction chamber (not shown) kept at 100° C. and 0.1 Pa, respectively, and Ar supplied at a flow rate of 10 sccm, to form a storage element film 30 covering the resistance heating element film 28 and made of a phase change material, i.e., GeSbTe.

Next, in the step of FIG. 1D, CMP is performed using an acid silica containing slurry to remove part of the storage element film 30 located on the first insulating film 12. In this case, by using the acid silica containing slurry, a very hard Al oxide generated due to oxidation of TiAlN, i.e., a lower layer film, serves as an etching stopping layer. Thereafter, the Al oxide is removed with a low concentration HF solution and then CMP is performed using a natural silica slurry to remove the remaining protection film 24 made of TiAlN and SiN. Note that the two CMPs in this step are performed under the process condition at a pressure of 3 PSI ($2.0 \times 10^4$ Pa), a head rotation speed of 85 rpm, a table rotation speed of 90 rpm, and a slurry flow rate of 200 ml/min. In general, when CMP is performed to a layer having different levels, the larger a difference between the levels is, the larger a polishing rate becomes. Accordingly, in this case, the storage element film 30 in the logic section 16 and the resistance heating element film 28 (which are both shown in FIG. 1C) are removed with priority. Therefore, it is possible to reliably keep GeSbTe of the storage element film 30 and TiAlN of the resistance heating element film 28 from remaining in the logic section 16.

Next, in the step of FIG. 1E, SiC or SiN is deposited as the first barrier film 32 over the substrate to a thickness of 50 nm by plasma CVD. Next, $SiO_2$ or SiOC film is deposited as a second insulting film 34 to a thickness of 200 nm by plasma CVD.

Figure 1F:
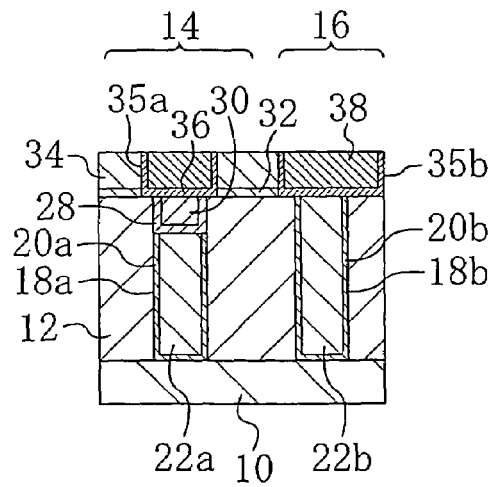

Next, in the step of FIG. 1F, etching is performed to remove part of the second insulating film 34 located on the storage element film 30 and the tungsten plug 22b, thereby forming a groove (not shown) reaching the first barrier film 32. In this case, etching is performed under the condition in which the etching selection ratio of a material for the second insulating film 34 is higher than that of the first barrier film 32. Thus, etching tends to be stopped at a time when the etching has passed through the second insulating film 34 and reaches the first barrier film 32. After this first etching, another etching is performed to remove the first barrier film 32, thereby forming grooves 35a and 35b each reaching the storage element film 30 and the tungsten plug 22b. As described above, by performing two etching processes to form the groove 35a reaching the storage element film 30, etching damages given to GeSbTe, i.e., a material for the storage element film 30 can be minimized.

Thereafter, by performing reactive sputtering using Ta as a target, TaN, i.e., the second barrier film 36 is deposited on bottom and side surfaces of the grooves 35a and 35b to a thickness of 10 nm. Furthermore, a Cu seed layer (not shown) is deposited on the second barrier film 36 by sputtering and then a Cu film (not shown) is deposited over an entire surface of a wafer by electrolytic plating. Then, by performing CMP, excessive Cu located on the second insulating film 34 and the like is removed so that only part of the Cu film located in the grooves 35a and 35b remains. Thus, a Cu interconnect 38 is formed.

Figure 5:
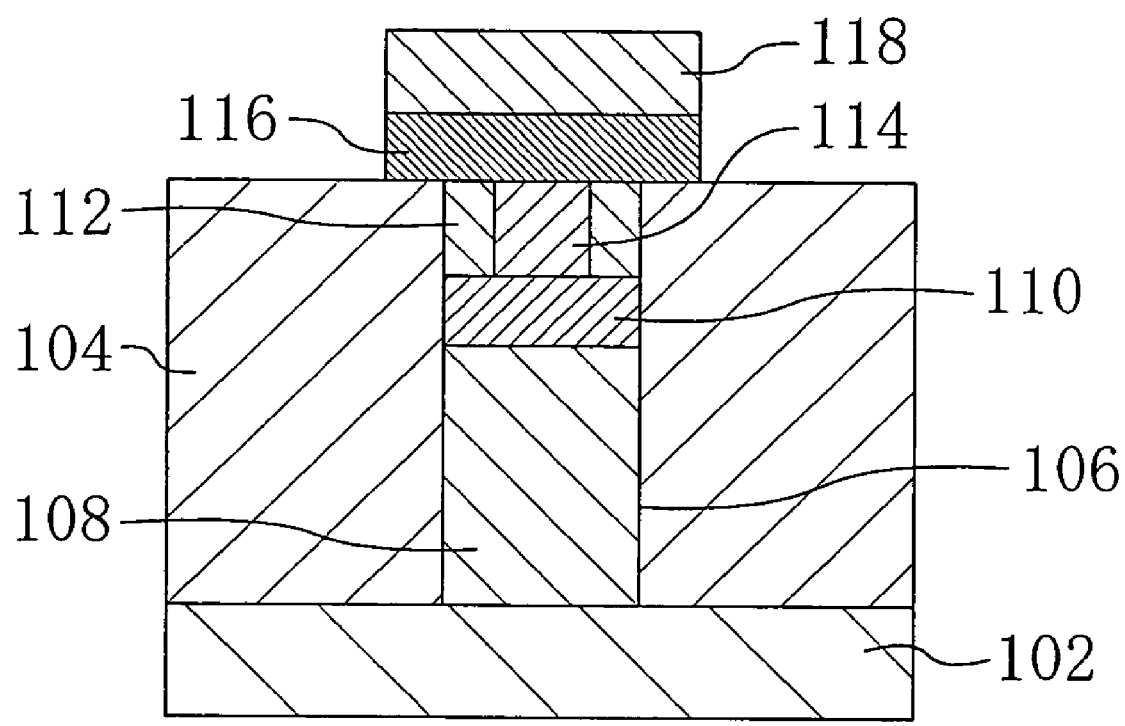
FIG. 5 is a cross-sectional view illustrating a known semiconductor memory device using a chalcogenide material.

In this embodiment, the storage element film 30 and the resistance heating element film 28 in the memory section 14 can be formed in a more simple manner than the known method and with consistency with a logic process. That is, as shown in FIG. 5, the number of process steps such as lithography and etching performed separately from a logic process can be reduced, compared to the known semiconductor memory device. Accordingly, fabrication process steps can be simplified.

Furthermore, the respective structures of the storage element film 30 and the resistance heating element film 28 in the memory section 14 are simplified. This allows size reduction and integration of elements.

Note that the fabrication method of this embodiment is mainly applied to a standard process in the 0.13 μm or less generation.

Figure 3:
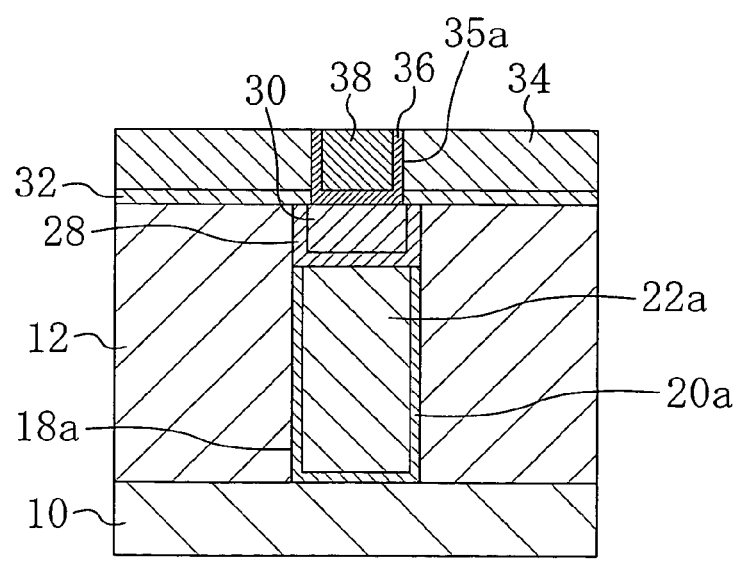
FIG. 3 is a cross-sectional view illustrating a modified example of a semiconductor memory device of an embodiment of the present invention.

Moreover, in FIG. 1F, the case where the width of an interconnect including the Cu interconnect 38 and the second barrier film 36 is formed to be larger than that of the contact hole 18a is shown. However, in this embodiment, as shown in FIG. 3, the width of the interconnect including the Cu interconnect 38 and the second barrier film 36 may be smaller than that of the contact hole 18a. In that case, a current flowing through the storage element film 30 becomes larger than that of the resistance heating element film 28 made of TiAlN having high resistance. Therefore, a current component generated due to the resistance heating element film 28 being brought into contact with the second barrier film 36 can be almost completely cut off.

Second Embodiment

In this embodiment, the case where the resistance heating element film 28 and the storage element film 30, which are provided in the first insulating film 12 in the first embodiment, are provided in the second insulating film 34 will be described. FIGS. 4A through 4F are cross-sectional views illustrating respective steps for fabricating a semiconductor memory device according to a second embodiment of the present invention. In this embodiment, a first insulating film 12, contact holes 18a and 18b, adhesion layers 20a and 20b, and tungsten plugs 22a and 22b are first formed in the step of FIG. 4A in the same manner as in the step of FIG. 1A.

Figure 4A:
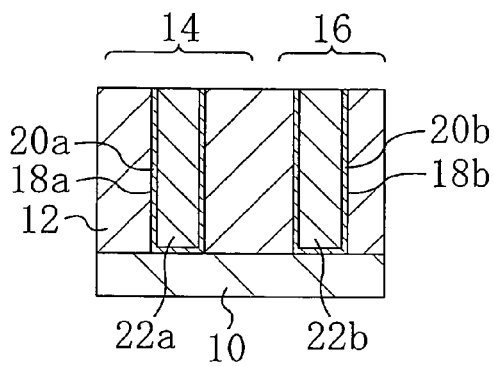
FIGS. 4A through 4F are cross-sectional views illustrating respective steps for fabricating a semiconductor memory device according to a second embodiment of the present invention.
Figure 4D:
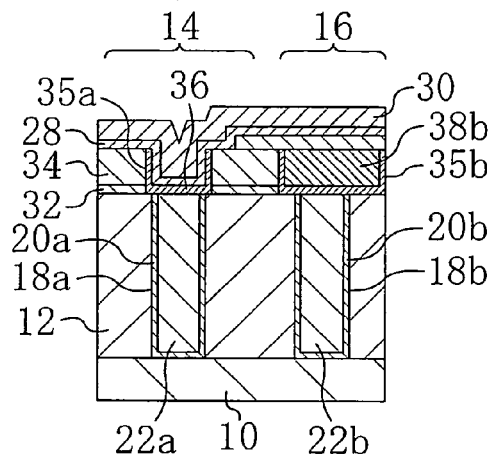
Figure 4B:
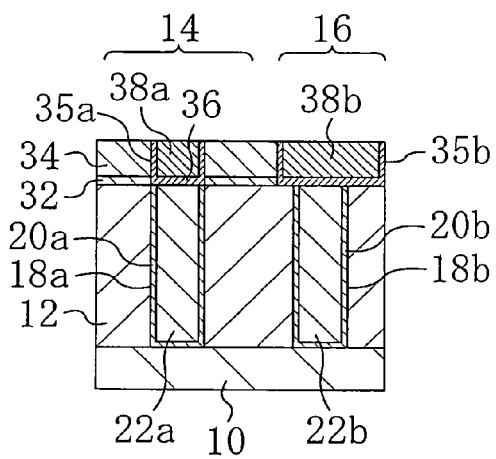

In the step of FIG. 4B, a first barrier film 32 made of SiC or SiN is deposited over the first insulating film 12 and the tungsten plugs 22a and 22b to a thickness of 50 nm by plasma CVD. Subsequently, a second insulating film 34 made of $SiO_2$ or a SiOC film is deposited over the first barrier film 32 to a thickness of 200 nm by plasma CVD.

Next, with a resist mask (not shown) formed over the first insulating film 12 so as to have openings through which the tungsten plugs 22a and 22b and part of the substrate located around the tungsten plugs 22a and 22b are exposed, etching is performed using the first barrier film 32 as an etching stopper to remove the second insulating film 34 and then another etching is performed to remove the first barrier film 32, thereby forming grooves 35a and 35b reaching the tungsten plugs 22a and 22b, respectively. Thereafter, reactive sputtering using Ta as a target is performed to form a second barrier film 36 made of TaN and having thickness of 10 nm on bottom and side surfaces of the grooves 35a and 35b. Subsequently, sputtering is performed so that the second barrier film 36 is covered with a Cu seed layer (not shown) and then a Cu film (not shown) filling in the grooves 35a and 35b is formed over an entire surface of the substrate by electrolytic plating. Thereafter, CMP is performed to remove part of the Cu film located on the second insulating film 34 and leave only part of the Cu film filling the grooves 35a and 35b. Thus, Cu interconnects 38a and 38b are formed.

Figure 4E:
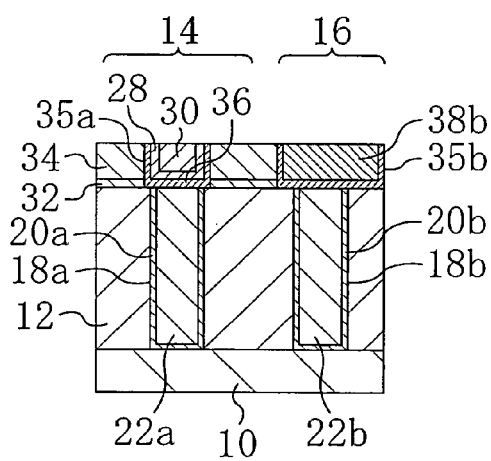
Figure 4C:
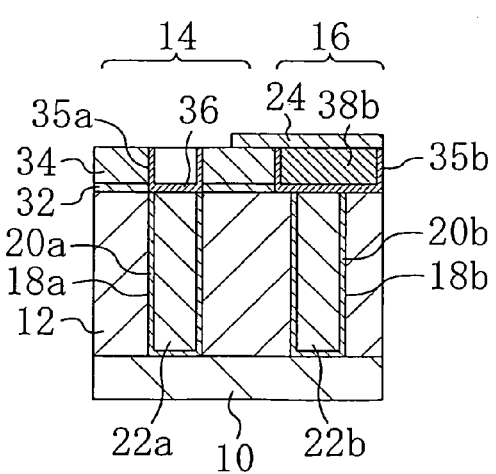

Next, in the step of FIG. 4C, $SiH_4$ and $NH_3$ are supplied by plasma CVD, with a substrate temperature kept at 400° C., to form an SiN film (not shown) covering the second barrier film 36 and the Cu interconnect 38a (shown in FIG. 4B) and having a thickness of 20 nm. It is preferable that the SiN film (not shown) is formed at a low temperature of temperature of 450° C. or less so that properties of the Cu interconnects 38a and 38b, the tungsten plugs 22a and 22b, and a transistor (not shown) which are located in lower layers are not deteriorated.

Next, a resist mask (not shown) is formed so as to cover part of the SiN film located in the logic section 16 and then reactive plasma etching is performed using $CHF_3$—Ar—$O_2$ gas to form a protection film 24 covering the Cu interconnect 38b and the second insulating film 34 in the part of the SiN film located in the logic section 16. Thereafter, by performing etching using an $H_2SO_4$ containing solution, the Cu interconnect 38a (shown in FIG. 4B) in the memory section 14 is selectively removed to expose the second barrier film 36 covering an internal surface of the groove 35a.

Next, in the step of FIG. 4D, reactive sputtering is performed, with the temperature and pressure of a reaction chamber (not shown) kept at 100° C. and 0.2 Pa, respectively, and Ar and $N_2$ supplied at flow rates of 21 sccm and 42 sccm, respectively, to form a resistance heating element film 28 made of TiAlN, covering bottom and side surfaces of the groove 35a in the memory section 14 with the second barrier film 36 interposed between the resistance heating element film 28 and the tungsten plug 22a and extending on the second insulating film 34 and the protection film 24. Subsequently, sputtering is performed, with the temperature and pressure of the reaction chamber (not shown) kept at 100° C. and 0.1 Pa, respectively, and Ar supplied at a flow rate of 10 sccm, to form a storage element film 30 made of GeSbTe and covering the resistance heating element film 28.

Next, in the step of FIG. 4E, polishing is performed by CMP to remove parts of the storage element film 30 and the resistance heating element film 28 located on the second insulating film 34 and leave parts of the storage element film 30 and the resistance heating element film 28 filling the groove 35a. Thereafter, the protection film 24 is removed.

Figure 4F:
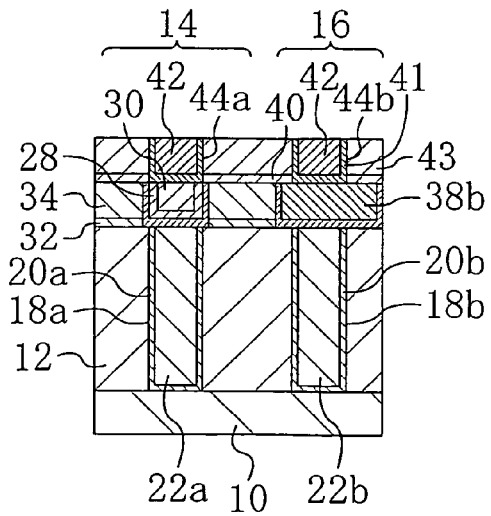

Next, in the step of FIG. 4F, a barrier film 40 is formed in the same manner as that for forming the first barrier film 32 so as to cover the second insulating film 34, the resistance heating element film 28, the storage element film 30 and the Cu interconnect 38b, and then a third insulating film 43 is formed on the barrier film 40. A groove 44a passing through the third insulating film 43 and the barrier film 40 to reach the storage element film 30 and a groove 44b reaching the Cu interconnect 38b are formed. And then a TaN barrier film 41 covering bottom and side surfaces of the grooves 44a and 44b and a Cu via 42 filling the grooves 44a and 44b with the TaN barrier film 41 interposed between the Cu via 42 and each of the storage element film 30 and the Cu interconnect 38b are formed.

In this embodiment, the storage element film 30 and the resistance heating element film 28 in the memory section 14 can be formed in a more simple manner than in the known method and with consistency with a logic process. That is, as shown in FIG. 5, the number of process steps such as lithography and etching performed separately from a logic process can be reduced, compared to the known semiconductor memory device. Accordingly, fabrication process steps can be simplified.

Furthermore, the respective structures of the storage element film 30 and the resistance heating element film 28 in the memory section 14 are simplified. This allows size reduction and integration of elements.

Note that in the first and second embodiments, TiAlN is used as the resistance heating element film 28. However, a material, such as TiSiN, TaAlN and TaSiN, made of conducting metal and insulation nitride may be used, instead of TiAlN.

What is claimed is:

1. A semiconductor memory device comprising:
   a substrate;
   an insulating film formed on the substrate;
   a storage element formed of a phase change material in an upper portion of the insulating film;
   a resistance heating element covering lower and side surfaces of the storage element;
   a plug provided in a region of the insulating film located under the storage element and being in contact with part of the resistance heating element covering the lower surface of the storage element and the substrate; and
   an interconnect being in contact with an upper surface of the storage element.

2. The semiconductor memory device of claim 1,
   wherein a hole reaching the substrate is provided in the insulating film,
   wherein a plug fills lower part of the hole, and
   wherein the storage element fills part of the hole located over the plug with the resistance heating element interposed between the storage element and the plug.

3. The semiconductor memory device of claim 1,
wherein the insulating film includes a first insulating film and a second insulating film provided on the first insulating film,
wherein the plug fills the hole provided in the first insulating film and reaching the substrate,
wherein the resistance heating element covers side and bottom surfaces of a groove provided in the second insulating film and reaching the plug, and
wherein the storage element fills the groove with the resistance heating element interposed between the storage element and the plug.

4. The semiconductor memory device of claim 1, wherein the resistance heating element is TiAlN, TiSiN, TaAlN or TaSiN.

5. The semiconductor memory device of claim 1,
wherein the substrate includes a memory section and a logic section,
wherein the storage element is provided in part of the substrate located over the memory section, and
wherein the plug reaching the substrate is provided in part of the substrate located over the logic section.

* * * * *